United States Patent
Chong et al.

(10) Patent No.: US 6,462,391 B1
(45) Date of Patent: Oct. 8, 2002

(54) SUSPENDED MOVING CHANNELS AND CHANNEL ACTUATORS FOR MICROFLUIDIC APPLICATIONS AND METHOD FOR MAKING

(75) Inventors: John M. Chong, Ithaca, NY (US); Noel C. MacDonald, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 09/686,885

(22) Filed: Oct. 12, 2000

Related U.S. Application Data

(62) Division of application No. 09/090,840, filed on Jun. 4, 1998, now Pat. No. 6,180,536.

(51) Int. Cl.[7] ............................................. H01L 29/82
(52) U.S. Cl. ......................................... 257/419; 257/417
(58) Field of Search ................................. 257/419, 417

(56) References Cited

U.S. PATENT DOCUMENTS

| | | | |
|---|---|---|---|
| 3,867,497 A | 2/1975 | Teich et al. | 264/81 |
| 4,178,197 A | 12/1979 | Marinace | 257/618 |
| 4,429,321 A | 1/1984 | Matsumoto | 347/50 |
| 4,438,191 A | 3/1984 | Cloutier et al. | 430/324 |
| 4,533,430 A | 8/1985 | Bower | 438/695 |
| 4,587,534 A | 5/1986 | Saito et al. | 347/56 |
| 4,614,119 A | 9/1986 | Zavracky et al. | 73/704 |
| 4,701,766 A | 10/1987 | Sugitani et al. | 347/47 |
| 4,716,423 A | 12/1987 | Chan et al. | 430/313 |
| 4,756,884 A | 7/1988 | Hillman et al. | 422/947 |
| 4,764,244 A | 8/1988 | Chitty et al. | 216/20 |
| 4,786,357 A | 11/1988 | Campanelli et al. | 216/27 |
| 4,824,073 A | 4/1989 | Zdeblick | 257/419 |
| 4,863,560 A | 9/1989 | Hawkins | 216/99 |
| 4,875,968 A | 10/1989 | O'Neill et al. | 347/63 |
| 4,891,120 A | 1/1990 | Sethi et al. | 204/600 |
| 4,894,664 A | 1/1990 | Tsung Pan | 347/47 |
| 4,906,840 A | 3/1990 | Zdeblick et al. | 310/328 |
| 4,908,112 A | 3/1990 | Pace | 356/344 |
| 4,961,821 A | 10/1990 | Drake et al. | 438/460 |
| 4,968,585 A | 11/1990 | Albrecht et al. | 430/324 |
| 5,015,850 A | 5/1991 | Zdeblick et al. | 369/101 |
| 5,096,535 A | 3/1992 | Hawkins et al. | 347/65 |
| 5,116,462 A | 5/1992 | Bartha et al. | 216/2 |
| 5,126,768 A | 6/1992 | Nozawa et al. | 347/65 |
| 5,132,012 A | 7/1992 | Miura et al. | 422/70 |
| 5,156,988 A | 10/1992 | Mori et al. | 438/20 |
| 5,180,480 A | 1/1993 | Manz | 204/644 |
| 5,194,133 A | 3/1993 | Clark et al. | 436/525 |
| 5,198,390 A | 3/1993 | MacDonald et al. | 438/666 |
| 5,209,818 A | 5/1993 | Bol | 216/2 |
| 5,211,806 A | 5/1993 | Wong et al. | 216/100 |
| 5,229,785 A | 7/1993 | Leban | 347/63 |
| 5,287,082 A | 2/1994 | Arney et al. | 338/307 |
| 5,296,114 A | 3/1994 | Manz | 204/451 |
| 5,304,487 A | 4/1994 | Wilding et al. | 422/947 |

(List continued on next page.)

OTHER PUBLICATIONS

Jingkuang Chen and Kensall D. Wise; "A Multichannel Neural Probe For Selective Chemical Delivery at the Cellular Level"; pp. 256–259.

Mark Zdeblick, Founder and Gordon Moore, Cofounder; Redwood Microsystems.New Frontier in Silicon Micromachining; Redwood Microsystems, Inc.

*Primary Examiner*—Jerome Jackson
(74) *Attorney, Agent, or Firm*—Jones, Tullar & Cooper, P.C.

(57) ABSTRACT

A microfabrication process for making enclosed, subsurface microfluidic tunnels, cavities, channels, and the like within suspended beams includes etching a single crystal silicon wafer to produce trenches defining a beam. The trench walls are oxidized, and the interior of the beam is etched through a channel via on the top of the beam to form a hollow beam with oxide sidewalls. The beam is released, and the via is then sealed to form an enclosed released channel beam.

20 Claims, 8 Drawing Sheets

U.S. PATENT DOCUMENTS

| | | | |
|---|---|---|---|
| 5,316,979 A | 5/1994 | MacDonald et al. | 438/702 |
| 5,317,533 A | 5/1994 | Quate et al. | 250/306 |
| 5,399,415 A | 3/1995 | Chen et al. | 428/209 |
| 5,415,727 A | 5/1995 | Gal et al. | 430/321 |
| 5,426,070 A | 6/1995 | Shaw et al. | 438/52 |
| 5,610,335 A * | 3/1997 | Shaw et al. | 73/514.36 |
| 5,628,917 A | 5/1997 | MacDonald et al. | 216/79 |
| 5,658,472 A | 8/1997 | Bartha et al. | 438/696 |
| 5,662,814 A | 9/1997 | Sugino | 438/719 |
| 5,681,484 A | 10/1997 | Zanzucchi et al. | 435/287.2 |
| 6,329,696 B1 * | 12/2001 | Tanaka | 257/419 |

* cited by examiner

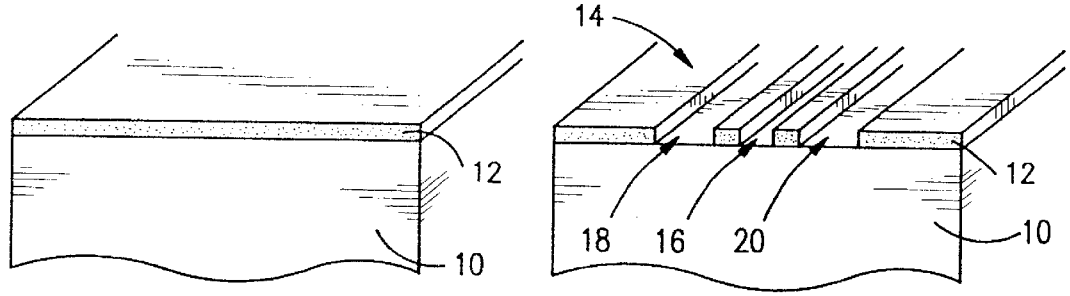
FIG. 1    FIG. 2
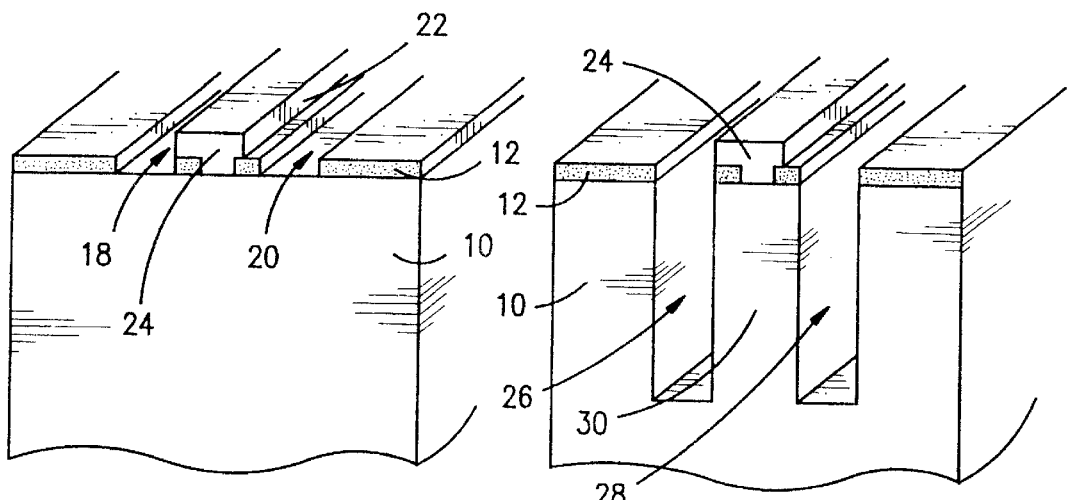
FIG. 3    FIG. 4
FIG. 10
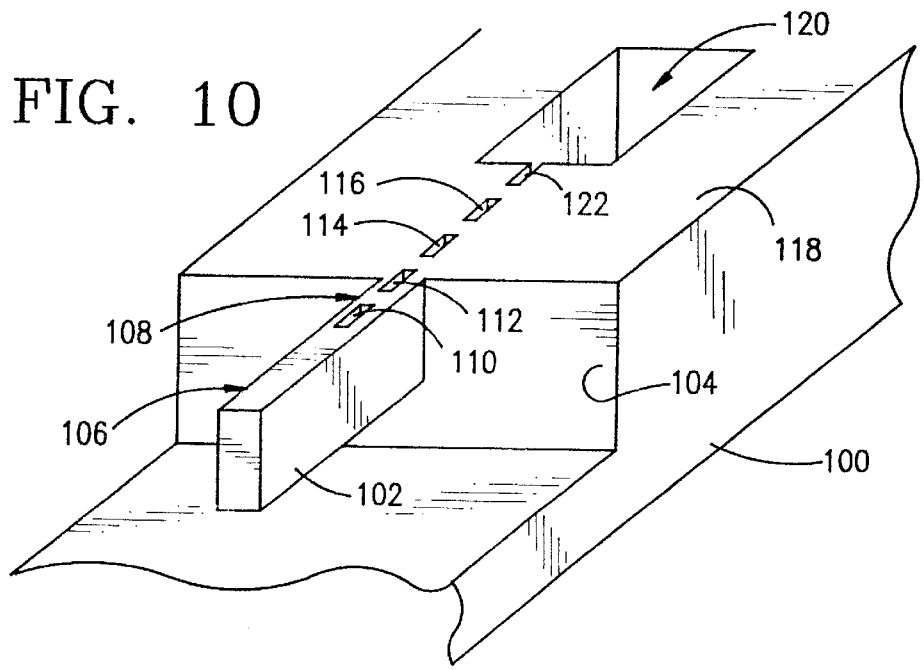

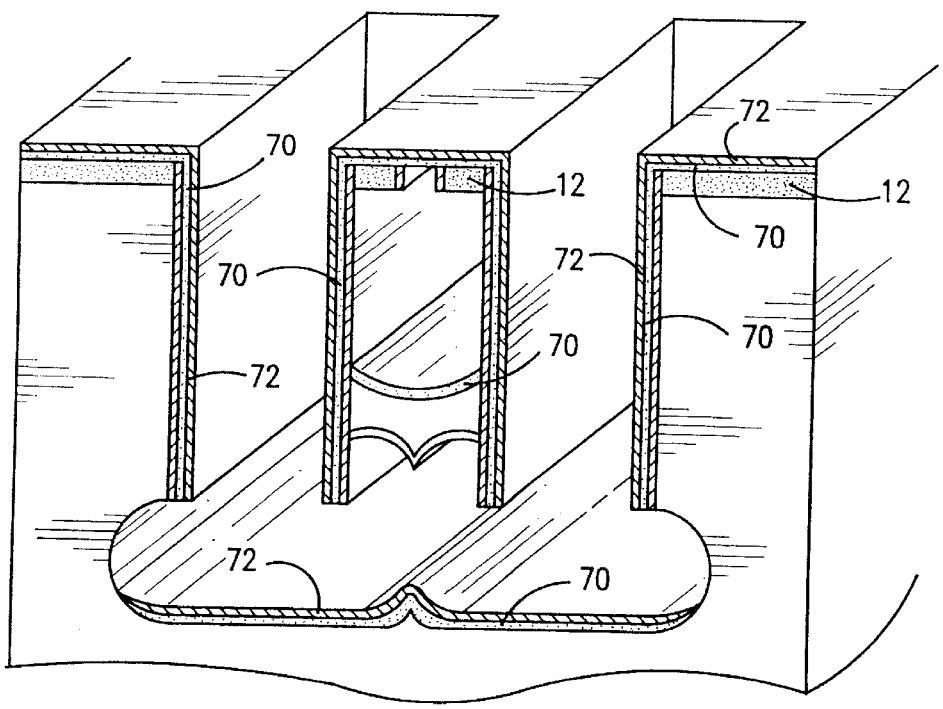
FIG. 9
FIG. 11
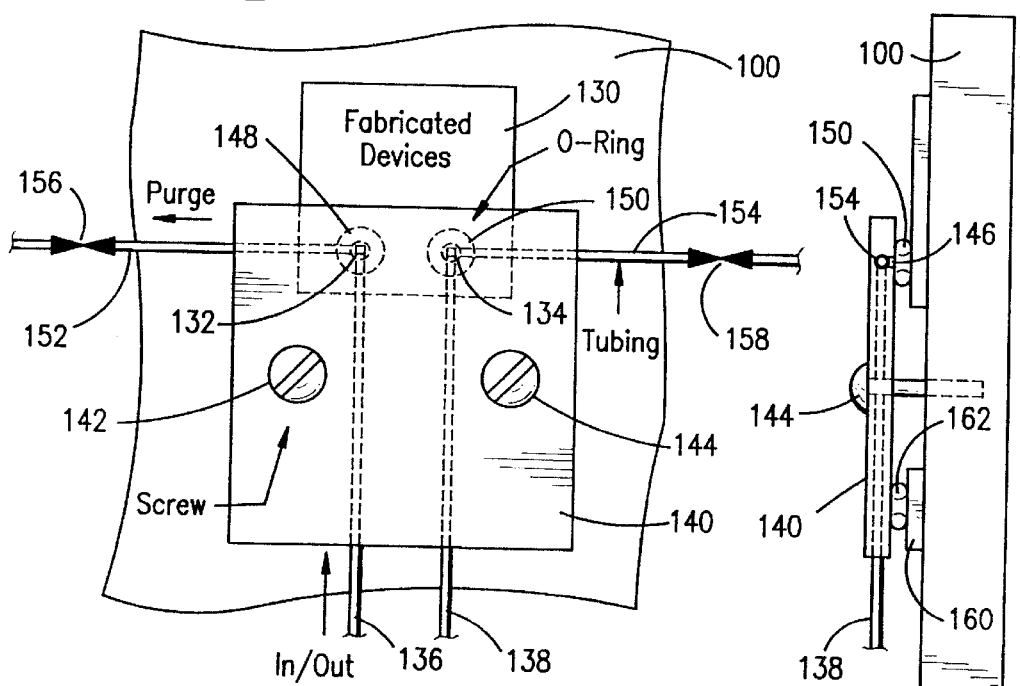
FIG. 12

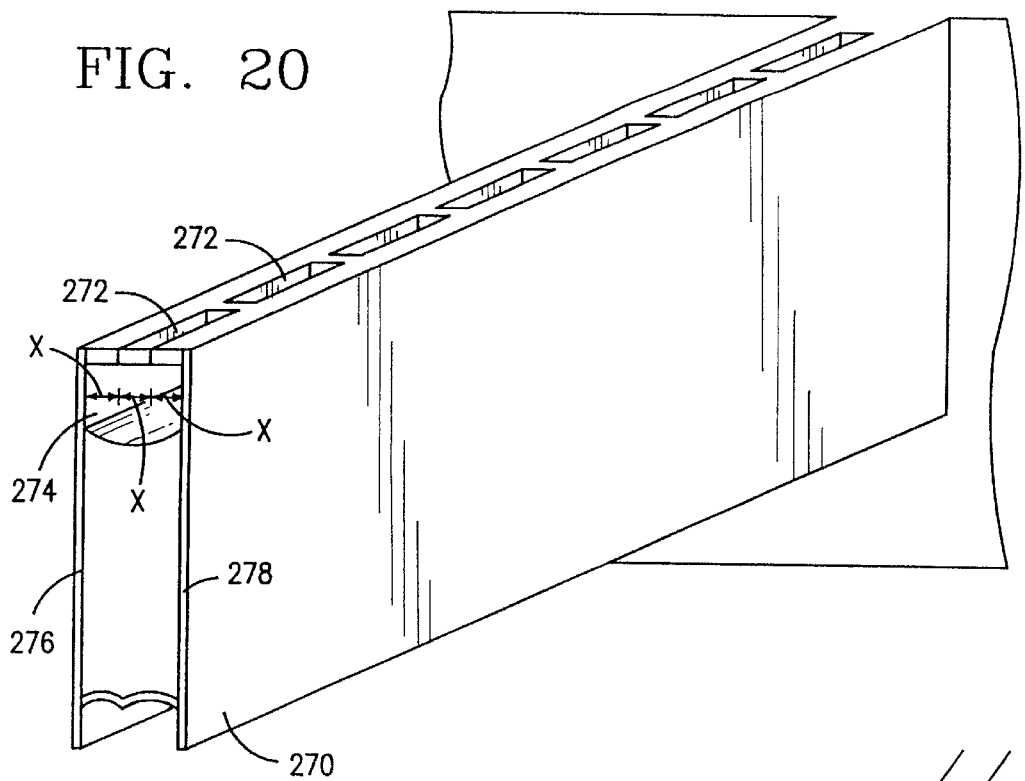
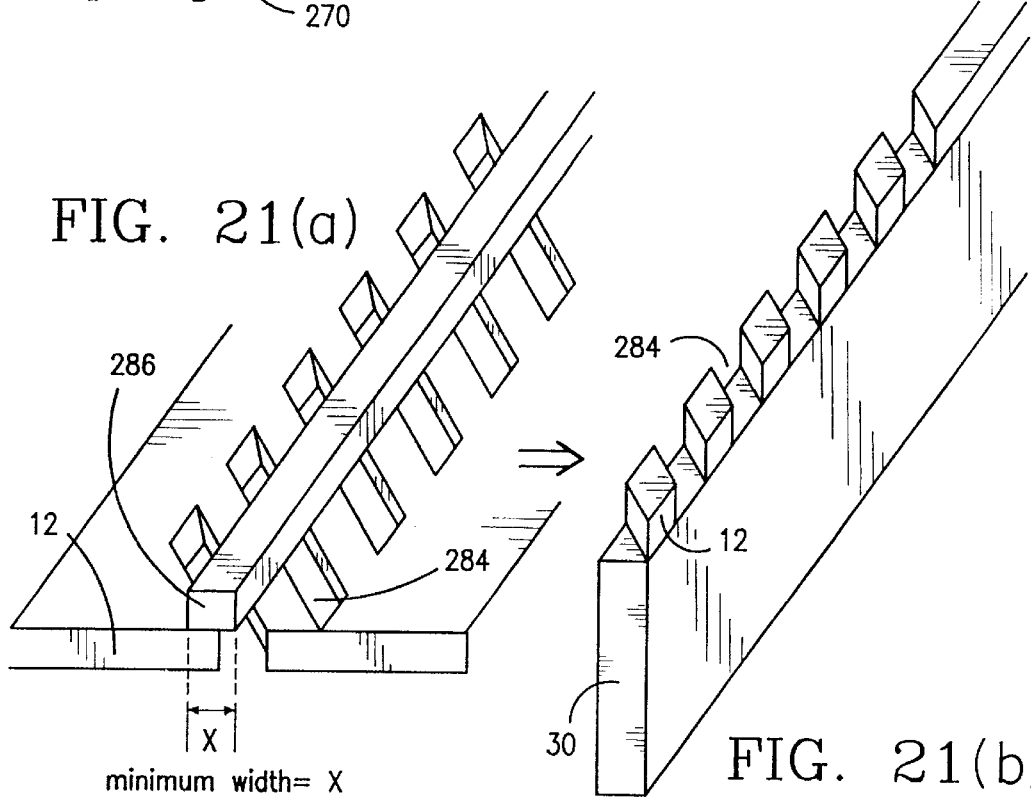

SUSPENDED MOVING CHANNELS AND CHANNEL ACTUATORS FOR MICROFLUIDIC APPLICATIONS AND METHOD FOR MAKING

The present application is a division of application Ser. No. 09/090,840, filed Jun. 4, 1998, and is related to co-pending application Ser. No. 08/867,060, filed Jun. 2, 1997, entitled "Microfabrication Process for Enclosed Microstructures", the disclosure of which is hereby incorporated herein by reference.

This invention was made with Government support under Grant No. DABT6395CO121, awarded by DARPA. The Government has certain rights in the invention.

BACKGROUND OF THE INVENTION

The present invention relates, in general, to a microfabrication process for making enclosed structures, and more particularly to a process for fabricating microfluidic tunnels, cavities, channels and similar structures suspended above a substrate or embedded below the surface of a substrate such as a single crystal silicon wafer, to the tunnels, cavities and related enclosed microstructures so fabricated, and to microfabricated systems or devices incorporating such enclosed structures.

Microfabrication holds the promise of dramatically improving the efficacy and cost of fluid processing systems. In general, microfabrication enables the production of large numbers of nearly identical devices, and as the number of devices produced by this technique increases, the cost per device decreases. As technology improves, which is inevitable considering the investment in and success of the semiconductor industry, the ability to fabricate microfluidic systems will also improve.

Early developments in micromechanics successfully led to the fabrication of microactuators utilizing processes which involved either bulk or surface micromachining. The most popular surface micromachining process used polysilicon as the structural layer in which the mechanical structures were formed. In a typical polysilicon process, a sacrificial layer was deposited on a silicon substrate prior to the deposition of the polysilicon layer. The mechanical structures were defined in the polysilicon, and then the sacrificial layer was etched partially or completely down to the silicon substrate to free the structures. Moving rotors, gears, accelerometers and other structures were fashioned through the use of this process to permit relative motion between these structures and the substrate. This process relied on chemical vapor deposition (CVD) to form the alternating layers of oxide and polysilicon and provided significant freedom in device design. However, CVD silicon was usually limited to layers no thicker than one or two micrometers.

An alternative was the use of bulk micromachining wherein a silicon substrate was etched and sculpted to leave a structure. This was typically done using wet chemical etchants such as EDP. However, such processes were dependent on the crystal orientation within the silicon substrate, with the result that the process was difficult to control. Accordingly, wet etch processes were not applicable to small structure definition.

To overcome the disadvantages of the forgoing processes, a reactive ion etching (RIE) process for the fabrication of submicron, single crystal silicon, movable mechanical structures was developed and is described in U.S. Pat. No. 5,198,390, assigned to the Assignee of the present application. That process utilized multiple masks to define structural elements and metal contacts, and permitted definition of small, complex structures in single crystal silicon. This process required a second lithography step which was difficult to apply to deeper structures because of problems in aligning the second mask, and accordingly a single-mask low temperature, self-aligned process for fabricating micron scale microelectromechanical (MEM) structures was developed and is described in U.S. Pat. No. 5,719,073, the disclosure of which is hereby incorporated herein by reference. The process described in the '073 Patent is a dry bulk micromachining process which uses reactive ion etching to both define and release structures of arbitrary shape having minimum dimensions of about one or two micrometers (i.e., micron-scale) and to provide defined metal surfaces on the release structures, as well as on stationary interconnects, pads, and the like. The single mask process permits fabrication of complex shapes, including triangular and rectangular structures as well as curved structures such as circles, ellipses and parabolas, for use in the fabrication of fixed and variable inductors, transformers, capacitors, switches and the like. The structures are released from the underlying substrate in the fabrication process, allowing them to be moved with respect to the substrate.

Although the single mask process described in the '073 Patent had numerous advantages and permitted fabrication of a wide variety of microelectromechanical structures on the surface of substrates, it was recognized that micron-scale structures located beneath the surface of the substrate would have a wide range of applications, and accordingly a process for producing such structures was described in the aforesaid co-pending application Ser. No. 08/867,060. As described therein, a process for fabricating enclosed micron-scale structures having minimum dimensions on the order of ten microns or less was developed. The enclosed structures included micron-scale cavities, tunnels, or other subsurface enclosures for carrying fluids such as gases or liquids under controlled conditions for use in electrophoresis, for use as ink jet nozzles, and the like. The microfabrication process utilized in that application was compatible with existing integrated circuit processes and structures so that it could be carried out on chips or wafers containing integrated circuits, and in addition was highly controllable to permit the fabrication of enclosed tunnel-like structures in a substrate and in a wide range and variety of configurations.

Microstructures in accordance with the '060 application were capable of use in biological and chemical synthesizers and analyzers, in gas sensors, ink dispensers for printers, and pressure sensors, in display devices, in optical applications, and the like. The subsurface structures were embedded in a substrate, or could be suspended by way of released beams, and could be fabricated in a wide range of cross sectional sizes and shapes. In accordance with that application, the subsurface structures were fabricated in single crystal silicon utilizing the SCREAM process described in the aforesaid U.S. Pat. No. 5,719,073. Thus, an isotropic silicon etch was used to produced a subsurface cavity beneath and along via channels to produce subsurface cavities conforming to the location of the via channels. The diameter, or cross-sectional size, of each cavity was determined by the duration of the etch. Thereafter, an oxide layer was deposited on the top surface of the substrate to fill in and cover the via channels to seal the entrances to the respective subsurface cavities. This formed enclosed subsurface structures having shapes and dimensions determined by the via channels and the etch duration. Thereafter, if desired, the subsurface structure could be located in a released beam by etching around the location of the subsurface cavity.

Microfabrication techniques applied to the construction of fluid processing systems have yielded a number of advantages over conventional fluid systems. Foremost are the benefits derived from the miniaturization of the system, including making systems more portable, making more efficient use of expensive reagents or limited samples, and by providing increased speed and sensitivity of chemical analyses. The ability to fabricate complex miniature systems also enables fundamental studies of fluid behavior on a microscale. Further, the tendency toward integration of microfabricated systems promises high degrees of automation and the parallel nature of the process and the capability to produce high volumes of devices leads to the ability to easily scale processing speed and throughput. Finally, the prospect of large numbers of inexpensive systems allows the realization of disposable systems to avoid contamination.

The foregoing and other advantages have led to an increase in research in microfluidics, with a number of products depending on fluidics having been developed; most notably the ink jet printer. Areas of additional research include the behavior of fluids on a microscale, fabrication of microfluidic components such as pumps and valves, and development of a wide range of sensors for parameters such as pressure, temperature, flow rate and pH. Further, such research has led to the development of systems such as micro total analysis systems, and the adaptation of analytical methods such as capillary electrophoresis and PCR.

The greatest benefits of such developments will be derived from the implementation of microfluidic systems, as opposed to isolated components. Only from a systems standpoint will the cost benefits be realized and automation be possible. For example, unless sample preparation is integrated into the system, the advantages of microfabricated fluidic devices will be limited in terms of cost, time and throughput. Thus, a number of integration issues must be taken into account when developing processes for fabricating fluidics systems, for it will be important to integrate such systems with electronic controls, with sensing, with feedback and logic and the like. Further, standard analytical techniques such as optical excitation and interrogation of chemical reactions must be considered, and integration with existing MEMS technology must be considered.

SUMMARY OF THE INVENTION

The present invention is directed to an improved process for fabricating microfluidic systems which requires only two or three masking steps, depending on the application, and which utilizes common VLSI equipment and techniques. The process is straightforward and robust, and takes into account the issues discussed above for a system approach. It is closely related to the SCREAM process (as described in U.S. Pat. No. 5,198,390 and U.S. Pat. No. 5,719,073 discussed above), and in this manner leverages the considerable development effort already expended and further relies on the capabilities already developed in the area of integration of MEMS structures with electronics, with the fabrication of large displacement actuators, with studies of the design considerations for large scale MEMS devices, and with the integration of optical components.

One of the most significant distinctions between the present invention and previous processes for fabricating microfluidic channels is the procedure for forming and suspending above a substrate a movable beam incorporating a channel. In accordance with the present invention, the location, size and shape of a released channel beam is defined by first etching trenches having vertical sidewalls in the substrate through a mask formed of a material resistant to silicon etchants. Such a material may be an oxide or nitride layer, a resist layer, or other suitable material, but which will be referred to hereinafter as an oxide or mask layer for convenience. The vertical sidewalls of the resulting trenches on each side of the beam are oxidized, or have oxide deposited thereon, and one or more channel vias leading to the interior of the beam between the oxidized walls are opened through the mask. The silicon substrate material within the beam between the sidewalls is then completely etched to a desired depth to form a hollow channel, leaving the oxide mask material on the top of the channel, and leaving the oxide side walls intact, with the remaining silicon forming a bottom wall. This results in a beam channel below the original surface of the substrate. The etching step also etches the trenches to release the beam by undercutting it, thereby producing a released beam channel. The size and shape of the channel is defined primarily by the oxide side walls of the trenches, rather than solely by the duration of the etch, as in prior processes. The resulting released microchannels can be moved and vibrated, thus providing a novel pumping mechanism and permitting the sensing of fluid parameters through resonant frequency shifts or through other changes in the dynamic behavior of the device. The process also yields optical access to the channel over most of its surface area. Furthermore, thermal isolation between channel regions is possible, and the process of the invention introduces techniques for mixing or separating fluids, which is not trivial in the highly laminar flow regime present in microchannels.

More particularly, the process of the invention includes a first step of depositing a mask layer such as oxide on the surface of a single crystal silicon wafer, or substrate. Next, the size, shape and location of beams, as well as the location of channel vias for use in producing hollow interior channels or cavities in the beams, are defined with a single mask, and the pattern of the beams and the channel vias is etched through the oxide mask layer. A resist is spun onto the surface of the wafer and is patterned so that the vias are protected from subsequent etching. Thereafter, the beams are formed by etching trenches surrounding the beams through the beam pattern into the silicon by way of a vertical deep reactive ion etch, with the oxide and resist acting as a mask. The resist is then stripped to expose the channel vias and a conformal layer of oxide is deposited over the entire surface of the wafer. Thereafter, an anisotropic etch is used to etch back from all the horizontal surfaces the oxide layer that was just deposited; that is, from the trench floors and from the top surface of the beam where the channel vias are located. Optionally, another vertical silicon etch is then carried out to define the approximate depth of the channels or cavities to be formed within the beams. This step deepens the trenches surrounding the beam and etches a pilot channel through the channel vias to provide improved control of the depth of the beam channels. The next step is an isotropic silicon etch that etches the silicon material of the beam through the vias, enlarging the pilot channel and preferably etching the interior of the beam completely to the oxide side walls. In addition, the isotropic etching step etches the trenches to release the beams. Finally, the via channels are sealed along the top of the beam, preferably by a PECVD oxide deposition during which the oxides build up rapidly at corners so that the channel vias are bridged by a sealing layer of the oxide. Metal is then deposited over the entire wafer, but because the self aligned metalization technique described in the aforesaid U.S. Pat. No. 5,719,073 is used, no patterning of the metal is necessary. At this point, if desired, an additional but optional lithography step using a thick resist can be used to define areas where the metal can be removed. This may desirable for optical viewing into the channel, as well as for removing metal films from springs to change their dynamic properties.

If desired, the channel vias can be sealed by a metal layer instead of a PECVD oxide to permit an electrical connection to a fluid carried in the beam channel.

The simplest version of the forgoing process requires only two masks, one to define the channel vias and the trenches which produce the released structures, and another to protect the vias. The entire process is closely related to the SCREAM process of the '073 patent, and therefore integrates well with actuators and devices constructed using that process.

In the preferred form of the invention described above, the channel vias are longitudinally aligned with the beams, but this alignment places lower limits on the width of the channels. A variation of the present invention allows the creation of arbitrarily narrow channels which would not otherwise be possible due to mask alignment or resolution limits. This is important in cases where the suspended channels form springs. When providing the aligned channel vias, the narrowest channel available is three times the minimum feature size. To overcome this limitation, the beams and channel vias can be defined separately through the use of two masks. In this case, the channel vias are oriented by one mask so that they cross the beam, thereby allowing the width of the channel vias to be independent of the width of the beam, which is defined by a second mask. Alignment is not an issue, since a shift of the relative positions of the mask layers still leaves channel vias crossing the beams.

All structures produced in accordance with the present invention can be formed utilizing two basic structural elements; beams and channel vias. Beams are typically narrow, high aspect ratio structures suspended above a substrate, while channel vias are openings in the masking layer through which an etching gas passes to etch channels in the beam. The volatile etch products are also removed through these vias. In accordance with the invention, most channel vias are eventually sealed with a deposited film, but some may be left open.

A variety of structures can be built from the foregoing basic building elements. Thus, suspended channels, embedded channels, solid beams and ports can all be provided. Suspended channels are formed from a combination of beams and channel vias. In this case, the beams are first etched and then the channel vias are used to hollow out the top portion of the beams. Embedded channels occur where there are channel vias but no beams. Solid beams exist where there are beams but no channel vias. Finally, ports which give off-chip access to the channels are formed from vias which are too large to be sealed.

BRIEF DESCRIPTION OF THE DRAWINGS

The foregoing, and additional objects, features and advantages of the invention will be apparent to those of skill in the art from the following detailed description of a preferred embodiment thereof, taken in conjunction with the accompanying drawings, in which;

FIGS. 1–9 illustrate the sequence of steps of a process for fabricating microfluidic systems incorporating subsurface channels, in accordance with the invention;

FIG. 10 illustrates a variety of channels fabricated in accordance with the process of FIGS. 1–9;

FIG. 11 is a top plan view of a fluid connector for micro fluidic subsurface channels;

FIG. 12 is a side view of the connector of FIG. 11;

FIG. 20 illustrates a high aspect ratio beam having in-line channel vias, in accordance with the invention; and FIGS. 21(a) and 21(b) illustrate the use of angled channel vias.

DESCRIPTION OF PREFERRED EMBODIMENTS

Figures 5, 6:
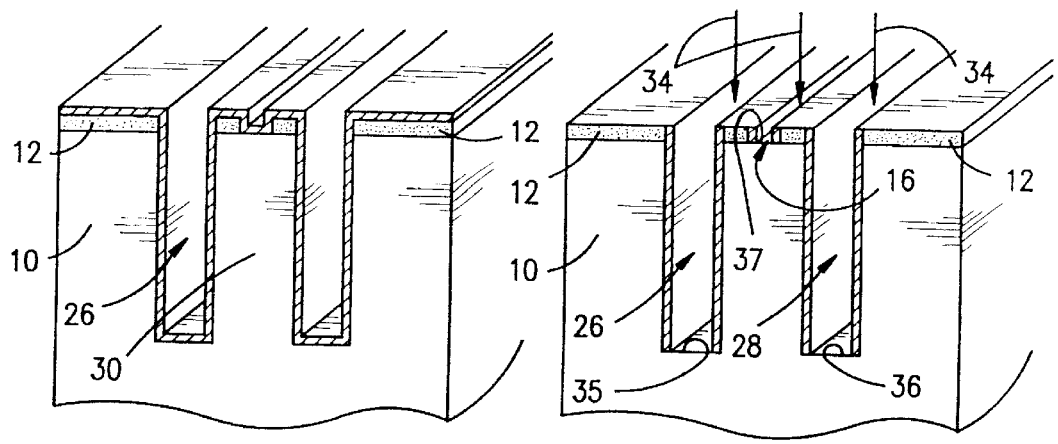

Turning now to a more detailed consideration of preferred embodiments of the invention, there is illustrated in FIGS. 1–9 the sequence of steps utilized in a new and unique process for fabricating microfluidic systems, in accordance with the present invention. The illustrated process is utilized to produce subsurface channels, or cavities, beneath the top surface of a single crystal silicon wafer or within released single crystal silicon beams fabricated in the wafers. The beams are typically narrow, high aspect ratio structures; that is, structures which have a height to width ratio of about 10 to 1, or more. The beams may extend upwardly from the substrate, or may be released from the underlying substrate and thus suspended for motion with respect to the substrate. In the latter case, the beams may be secured at one end to a substrate wall and extend as cantilevers into a cavity formed in the substrate, or may extend across the cavity and be secured at both ends to substrate walls.

As illustrated in FIGS. 1–9, the process is carried out on a wafer 10, or substrate, of single crystal silicon in which subsurface channels are to be formed, or from which either solid or channeled beams or released beams are to be formed. The top surface of the substrate 10 is covered by a suitable masking material, and thus may be oxidized, or a layer of nitride, oxide, resist, or other material may be deposited, to produce mask layer 12, which may also be referred to as an oxide layer. A suitable resist material is placed on the top surface of the oxide layer 12, and is patterned to produce an outline of the beams to be produced in the substrate 10 and to outline the location of vias through which subsurface channels are to be formed on the beam or on the substrate. The oxide layer is the etched through the pattern, transferring to the oxide layer a corresponding beam and via pattern generally indicated at 14 in FIG. 2. As illustrated, the pattern 14 includes a central region 16 and two parallel side regions 18 and 20, the central region defining the location of a via and the side regions 18 and 20 defining the location of trenches which will form a beam in the substrate. Thereafter, a protective resist layer 22 is spun onto the top surface of the oxide layer 12 and, as illustrated in FIG. 3, is patterned to expose trench regions 18 and 20 while providing a protective cap 24 for the via region 16.

The pattern for the protective mask does not have to be precisely aligned with the via region 16, since both the resist and the mask layer 12 will function as masks for the following silicon etch step. The protective mask only needs to cover the via region, and should not extend past the edge of the mask layer which defines the trench locations, as illustrated in FIG. 5.

Figure 7:
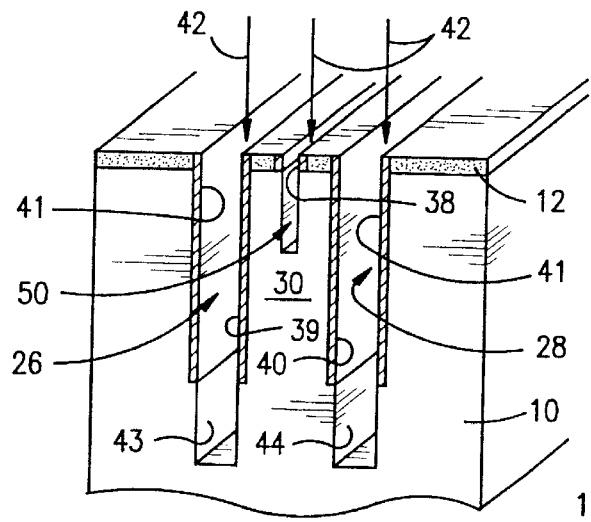

Thereafter, the trenches defined by regions 18 and 20 are etched with a vertical silicon etch using any suitable etching process where both a resist and an oxide can be used as a mask. For example, a deep RIE BOSCH etch (plasmatherm SLR-770 ICP etcher) may be used, with the oxide layer 12 and the resist layer 22, including the protective cap 24, serving as a mask for the etch. This etching step produces deep trenches 26 and 28 at regions 18 and 20, respectively, defining an upstanding beam portion 30 separated from the surrounding substrate 10. After the formation of trenches 26 and 28, the resist layer 22 is stripped, and a conformal layer of oxide 32 (see FIG. 5) is deposited over the entire surface of the wafer, or substrate. Thereafter, an anisotropic etch, indicated by arrows 34, is used to remove from all the horizontal surfaces the oxide that was just deposited; that is, to remove it from the floor 35 of trench 26, from the floor 36 of trench 28, and from the floor 37 of the via region 16, as well as from the top surface of the oxide mask layer 12, as illustrated in FIG. 6. This leaves the vertical surfaces covered with the oxide layer 32, including via walls 38, beam side walls 39 and 40, and substrate walls 41 (FIG. 7).

The next step is another vertical silicon etch, illustrated by arrows 42, which extends the depth of the trenches 26 and 28 below the bottom of the oxide layer 32, and thus below the side walls 39, 40 and 41, as illustrated at 43 and 44, and which etches through the via region 16 to produce a pilot channel 50 in the beam portion 30. The pilot channel 50 also extends below the bottom of the oxide via walls 38 in the via region 16. The etching of pilot channel 50, and the simultaneous deepening of trenches 26 and 28, is optional but has the effect of improving the control of the depth of the channel to be formed in the beam during the subsequent etching step (to be described) and in reducing the length of time required to achieve a desired channel depth.

Figure 8:
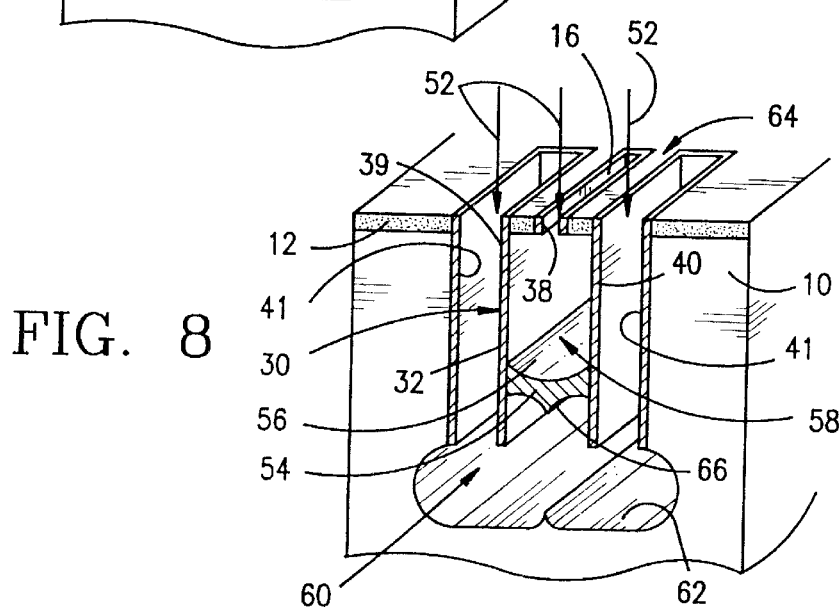

FIG. 8 illustrates the next step, which is an isotropic silicon etch, indicated by arrows 52. This etches the silicon beam in which pilot channel 50 is located, widening the pilot channel to remove the silicon within the beam 30 below the oxide mask layer 12 and between the side wall layers 39 and 40. The etching within walls 39 and 40 also extends downwardly below pilot channel 50 to a desired depth, deepening the channel in the silicon and leaving a silicon plug 54 at the bottom of the beam. The plug has a top surface 56 and forms a lower channel wall for the beam. The silicon etch 52 thus forms an enlarged cavity or beam channel 58 within beam 30. At the same time, the bottom portions of trenches 26 and 28 are etched to form a lower cavity 60 which extends beneath the side walls 39 and 40 and under the beam 30 to release it from the substrate 10. This causes the beam to extend over, and to be movable with respect to, the bottom wall 62 of lower cavity 60. In the illustrated embodiment, the beam 30 is integral at its end portion 64 with a vertical wall of the surrounding substrate so that the beam is cantilevered over the floor 62, but it will be understood that the beam may be secured to the substrate at its opposite end(not shown), as well. During formation of the cavity 60, the etchant also acts upwardly to remove some of the silicon from within the beam, between the lower edges of sidewalls 39 and 40 so that the bottom surface 66 of plug 54 is spaced above the bottom edges of sidewalls 39 and 40.

To close the via 16, and thus to seal the enlarged beam channel 58, a PECVD oxide deposition is carried out on the entire structure, placing another layer of oxide on the side walls 39 and 40 and across the top surface of the oxide layer 12 on the beam and on the top surface of the surrounding substrate, as indicated by layer 70 in FIG. 9. During this deposition the oxide builds up rapidly at corners, and extends over the via opening 16 with a sealing layer of PECVD oxide, as illustrated in the Figure. As there illustrated, during some deposition processes, a portion of the oxide material may fall through the via 16, and may coat the bottom wall 62 of cavity 60. After the via 16 is sealed, a metal layer 72 is sputtered over the entire wafer. Because the self-aligned metalization technique described in U.S. Pat. No. 5,719,073 is used, no patterning of the metal is necessary. However, if desired an additional, optional lithography step using a thick resist may be used to define areas where the metal can be removed. This may be desired for optical viewing into the channel, for more varied electrical isolation between portions of released structures, or for removing layers of metal from beams which are to move, or are to serve a springs, in order to control their degree of flexibility; that is, the Q of the beam.

If desired, a metal deposition step may be used to seal the vias 16 so that the metal can contact the fluid in the channel, as may be desired when one wants to control the electrical potential of the fluid or to inject current into the fluid.

Although FIGS. 1–9 illustrate the formation of a channel within a released beam, as illustrated in FIG. 10 such channels may be formed in non-released portions of the substrate 10. Furthermore, if desired, the beam may be fabricated at some locations to be solid, without channels. Thus, FIG. 10 illustrates a substrate 100 which incorporates a beam portion 102 fabricated to extend as a cantilever from a wall portion 104 of the substrate. The end region 106 of the beam is solid silicon, while a second region 108 incorporates longitudinally aligned vias 110 and 112 extending along a length of the beam to provide a channel within the beam, below its top surface, in a manner described with respect to FIGS. 1–9. The vias may be closely spaced to produce a single channel along the length of the beam, or spaced apart to produce individual, corresponding channel portions.

Similarly, vias 114 and 116 on the top wall 118 of substrate 100 may be used to produce subsurface channels within the substrate itself. An enlarged channel is generally illustrated at 120 where an enlarged via 122 provides an open channel which serves as a port for connection to subsurface channels. Such a port may serve as a connection to external equipment, for example in the manner illustrated in FIGS. 11 and 12, to which reference is now made. As there illustrated, the substrate 100 includes a region 130 where various fabricated devices are located, including subsurface channels, released beams, or the like, with ports such as those illustrated at 120 in FIG. 10 being located at 132 and 134 in the region of the fabricated devices. Connection is made to these ports by means of an input tube 136 leading to port 132 and an input tube 138 leading to port 134. The input tubes 136 and 138 are located in a mounting platform 140, which may be fastened to the top surface of substrate 100 by suitable fasteners such as screws 142 and 144. The tubes 136 and 138 lead to downwardly facing exit apertures in platform 140, such as the aperture 146 illustrated in FIG. 12, located over the ports 132 and 134. The exit apertures and the ports are surrounded by O rings 148 and 150, respectively, to seal the platform 140 to the ports 132 and 134. In this way fluids may directed into the ports at 132 and 134 by way of corresponding tubes 136 and 138.

Exit tubes 152 and 154 are also provided, these tubes extending through the platform 140 and connecting to the downwardly facing apertures, such as aperture 146. Preferably, the outlet tubes incorporate valves 156 and 158, respectively. The platform 140 may be held level by a spacer block 160 placed under the edge of the platform, with an O ring 162 providing a mounting surface similar to that provided by O rings 148 and 150.

Figure 13:
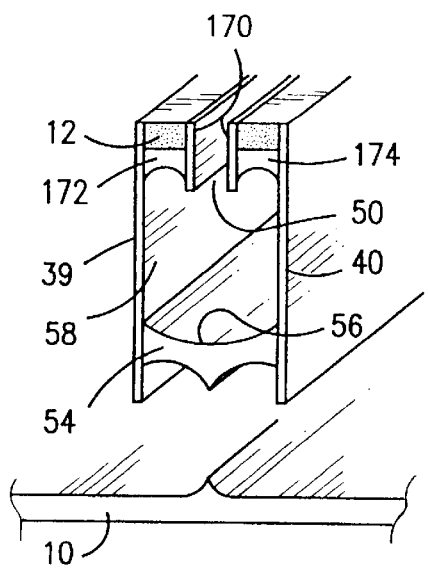
FIG. 13 illustrates a modification of the process of FIGS. 1–9.

A modification of the process discussed above with respect to FIGS. 1–9 is illustrated in FIG. 13, which is a perspective view of the end of a released beam. In this case, the process of FIGS. 1–9 is modified by including after the step of FIG. 7 a second oxide deposition step to provide oxide sidewalls 170 for the via pilot channel 50 before it is enlarged to produce the enlarged beam channel region 58. When this is done, silicon regions 172 and 174 are protected from the later etching of chamber 58, hereby isolating the segments 172 and 174 from the bottom wall, or plug, 54. These upper and lower silicon regions can be connected to suitable electrical sources to provide a voltage potential across the chamber 58, if desired. It will be understood that the silicon dioxide walls 39 and 40 are electrically insulating to maintain the isolation between the upper and lower silicon segments.

In cases where there are silicon segments at the top of a beam, such as the structure illustrated in FIG. 13, or where the beam is solid silicon, it may be desirable to provide a contact between the silicon and the later- deposited metal layer. In such a case, the process steps described with respect to FIG. 9 would be modified by providing a patterning step after the deposition of oxide layer 70 and before the metal deposition step. The patterning step would permit location of contact vias 182 extending through the original oxide layer 12 to the silicon segment 172. Suitable dopants may be implanted in the silicon 172 through the contact via 182 and thereafter the metal layer such as layer 72 in FIG. 9 may be sputter-deposited onto the substrate. This metal layer may then be patterned to provide contact lines leading from the contact via 182 to other connection points on the substrate. Alternatively, the contact vias may be opened after the deposition of the oxide layer 12 in FIG. 1 and then the metal is sputtered so that the metal is in place before the beams and channels are formed. In this case, the patterning of the channel vias and beams would be designed to also etch through any metal that needs to be removed.

Figure 14:
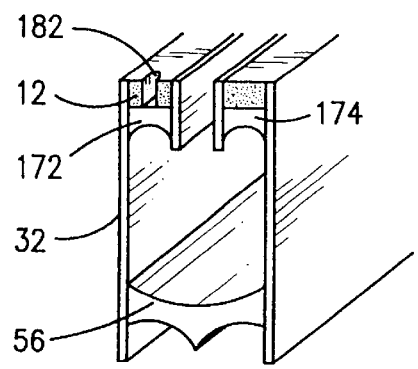
FIG. 14 illustrates the step of providing a contact via.
Figure 15A:
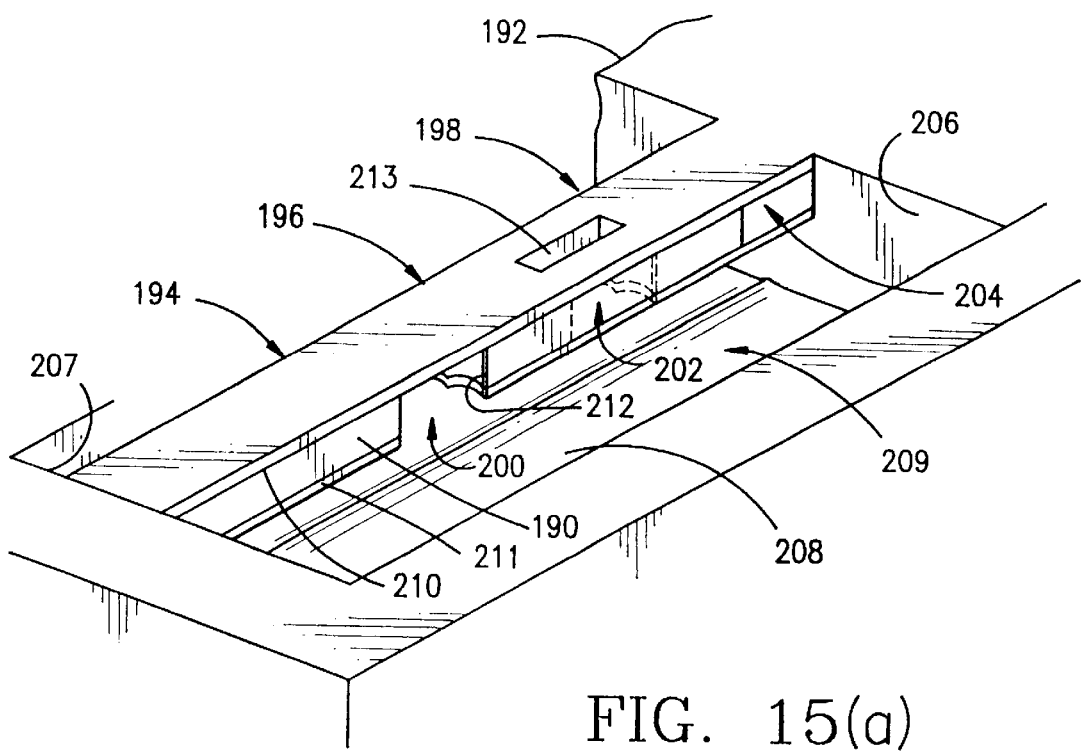
FIGS. 15(a) and 15(b) illustrate processes for isolating adjacent segments in a channel beam.

Not only may beam segments be provided at the top and bottom of the beam channel 58, as illustrated in FIGS. 13 and 14, but it may also be desirable to provide electrically isolated segments longitudinally spaced along a beam. This may be accomplished, as illustrated in FIG. 15, by providing channels at selected locations along the beam to permit etching away of silicon between adjacent segments. Thus, for example, beam 190 may be fabricated from a silicon substrate 192 and may be divided into three segments 194, 196 and 198 separated by insulating regions 200, 202 and 204. As illustrated, the beam 190 extends from a wall portion 206 to a wall portion 207 of the substrate 192, above the floor 208 of a cavity 209. Segments 194, 196 and 198 are silicon with an oxide top layer 210, an oxide bottom layer 211, and oxide side walls 212. Segment 194 is separated from segment 196 by a region 200 from which the silicon beneath the top layer 210 has been removed. The isolating region 200 is formed by removing a portion of the sidewall 212 by etching, and then silicon beneath the layer 210 is removed by an $SF_6$ etch. This provides electrical isolation between the silicon in segment 194 and the silicon in segment 196, with the two segments being held together by oxide layer 210.

The insulating region 202 may be formed by providing a channel via 213 in the top of the beam. Before it is sealed, a resist is used to mask all except the portion of the beam at region 202 and an $SF_6$ etch is used to etch the silicon out of the region. This leaves the oxide layer 210, the sidewalls 212, and the floor of the just-etched cavity mechanically joining the two segments while leaving them electrically isolated.

A third way to provide electrical isolation between adjacent segments, or between the beam and the substrate, is illustrated at segment 204 where the silicon beam is oxidized completely through the thickness of the beam. This makes a stronger beam, while still electrically isolating adjacent segments.

Figure 15B:
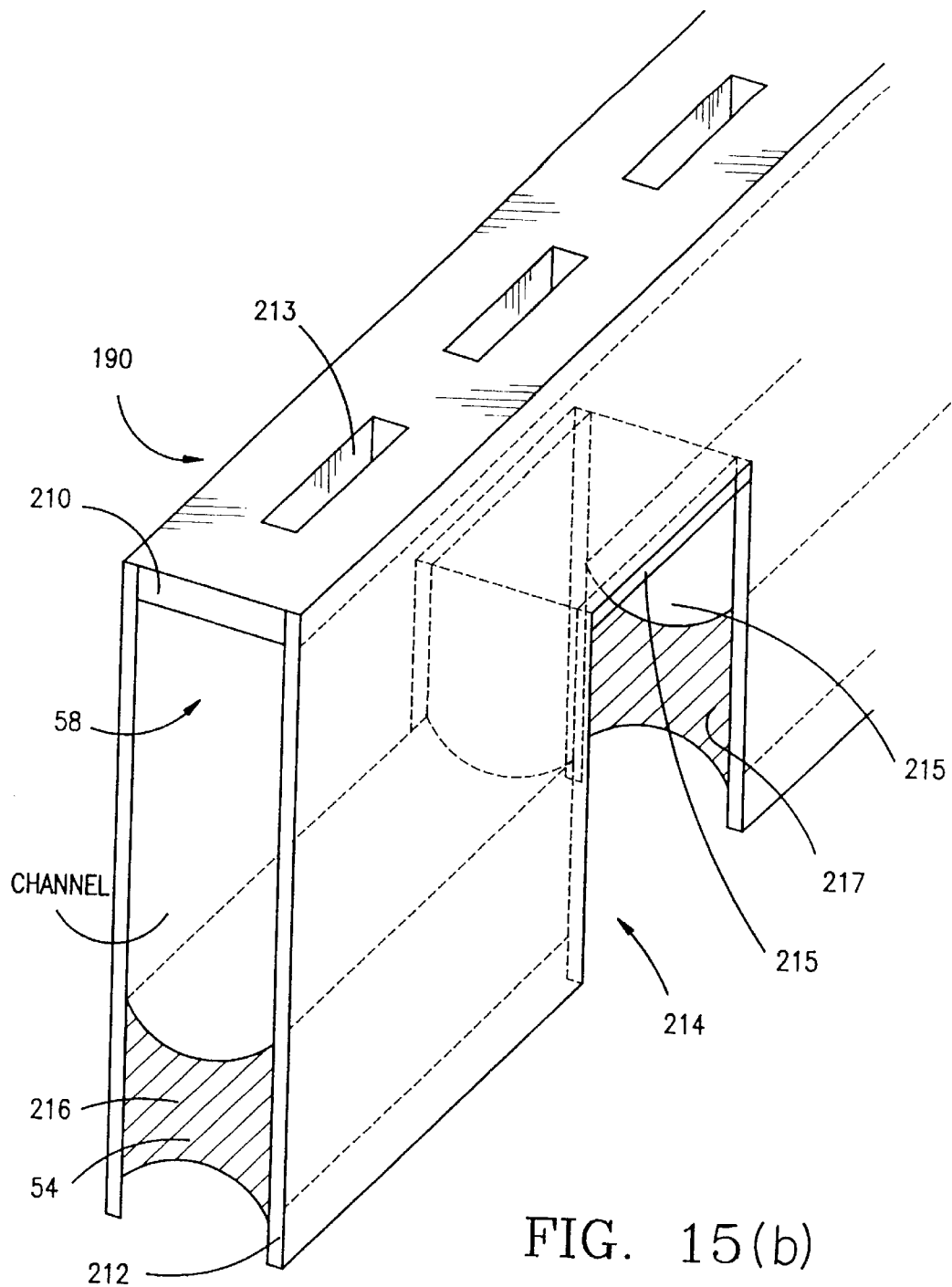

A fourth way to provide electrical isolation between adjacent segments, or between the beam and the substrate, is illustrated in FIG. 15(b). In this case, the beam 190 is fabricated so it varies in depth along its length. The depth of a shorter segment 214 is less than the depth of the beam channel 58. Prior to etching the silicon within the beam, an oxide layer 215 is deposited on the under side of the shorter segment so that a solid "floor" will exist within the short segment once the silicon is removed. When the channel 58 is etched through the channel vias 213, all the silicon is removed from the interior of the shorter segment, leaving only the oxide 215, which provides mechanical support between adjacent silicon segments 216 and 217 and also allows fluid to flow between the segments, if desired. This technique is not limited to isolating two segments of a suspended channel; it could easily connect two solid beams. Although these isolation techniques are all illustrated in FIGS. 15(a) and 15(b), it will be understood that they utilize independent methods, and are shown together for convenience of illustration.

The oxide sidewalls 39, 40 illustrated in the beam structures of FIGS. 8, 9, 13, and 14 are optically transparent to permit optical monitoring and optical excitation of fluids within the enlarged channels, such as the channels 58 illustrated in these Figures. In the embodiment of FIG. 9, the beam is covered by a metal layer, but this layer can be masked and patterned to remove selected regions of the metal to allow optical monitoring of the beam through the underlying oxide.

Figure 16:
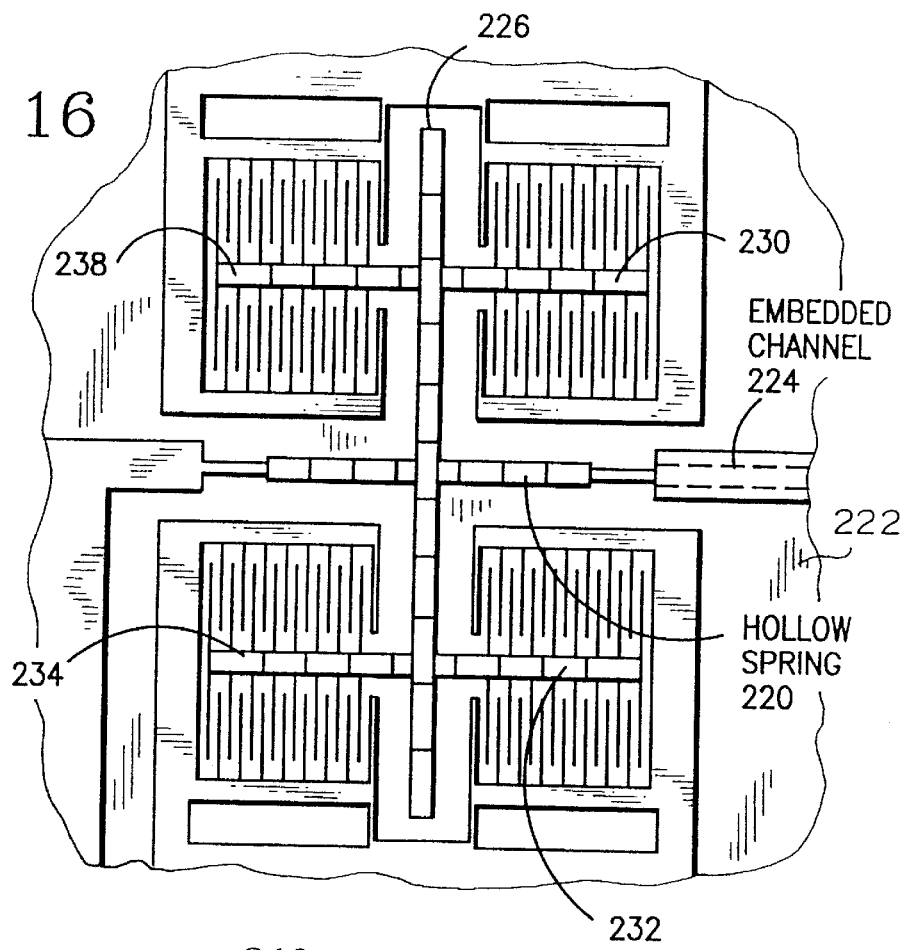
FIG. 16 illustrates a movable microstructure incorporating both hollow channel beams and solid beams.

The released beams may take a variety of shapes, and thus need not be linear as illustrated in the forgoing figures. Curved beams may be provided, and the beams may be either solid or hollow, or partially solid and partially hollow, as illustrated in FIG. 10. Further, they can be interconnected with other beams to form a variety of structures having a wide range of utility. Thus, for example, as illustrated in FIG. 16, a hollow beam 220 mounted at opposite ends to a surrounding substrate 222 and connected to an embedded channel 224 in the substrate may be fabricated integrally with a movable backbone beam 226. The backbone is connected to laterally extending arms 228, 230, 232 and 234, which form a comb drive actuator for the backbone 226. By actuating the comb drives, which are interleaved fingers of capacitors, the backbone may be moved torsionally, pivoting about the beam 220 in and out of the plane of the paper with the backbone serving as a driver, or as a motion sensor. The backbone is made up of parallel solid beams, while the beam 220 is made up of parallel hollow beams. Beam 220 serves as a torsional spring to center the backbone within the comb drive actuator and may be used to regulate the motion of the backbone by varying its dynamic properties. This can be done by selectively filling the channels in the beam 220 with fluid, for example. Air under varying pressures or a liquid such as water can be used to change the characteristics of the beam 220, such as its stiffness or damping, thereby changing its resonant frequency. As the pressure in the hollow beam 220 increases, the stiffness of the beam also increases. Since it changes the resonant frequency of the device, this frequency can be used to measure the pressure in the hollow beam. Alternatively, the comb actuators can be used to vibrate the hollow spring, producing a mixing action or possibly a pumping action on the fluid in the spring. In general, then, applications of hollow or channeled beams in combination with actuators include sensing various characteristics of fluids within the channels, acting on fluids in the channels in some way, or changing the dynamics of the device by varying fluid properties such as potential, temperature, flow, pressure, etc.

Figure 17:
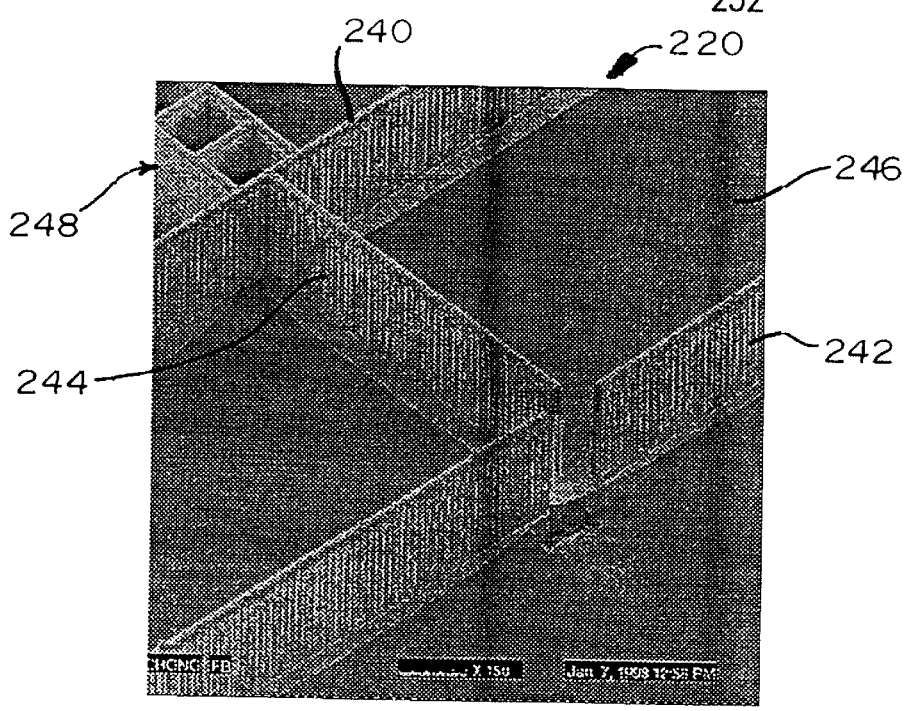
FIG. 17 is an enlarged, partially cut away view of a hollow channel beam.

FIG. 17 is an enlarged view of a hollow spring structure attached to a lateral comb-type actuator drive. As shown, the spring structure is, in a preferred embodiment, made up of a pair of parallel, longitudinally extending hollow beams 240 and 242 spaced apart by intersecting, spaced lateral beams 244. These beams are suspended above the floor of 246 of a cavity in the substrate 222, in the manner described with respect to FIGS. 1–9. A more nonconformed deposition technique such as evaporation can be used to reduce the sidewall films. Also illustrated in FIG. 17 is an example of a solid beam 248 which may also be made up of parallel longitudinal solid beams and lateral connecting solid beams. It should be noted that an arbitrary amount of the interior of any or all of the actuator beams can be hollowed out to carry fluids, so that the effects of the fluids on the dynamics of the device can be controlled.

Figure 18:
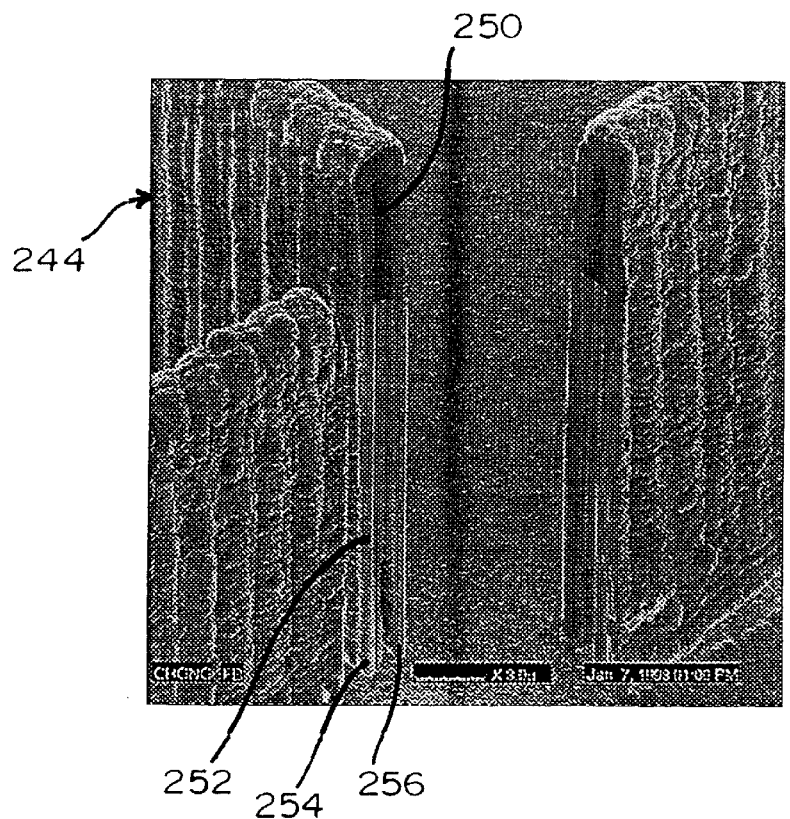
FIG. 18 is a further enlargement of the cut away portion of the structure of FIG. 17.

A further enlargement of the structure of FIG. 17 is illustrated in FIG. 18, showing a cut-away of the intersection of beams 242 and 244. As clearly illustrated in this figure, the beam 244 incorporates an enlarged channel 250 at its upper edge and includes a silicon wall portion 252 below the channel. The sidewalls 254 and 256 extend down below the bottom of wall portion 252 in the manner illustrated, for example, in FIG. 9.

Figure 19:
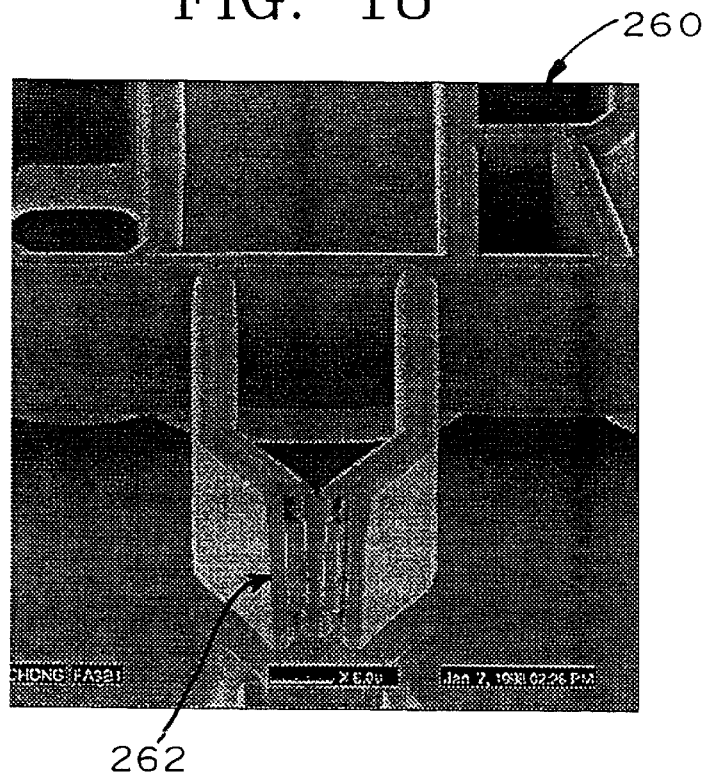
FIG. 19 is a perspective, partially cut away view of another hollow channel beam structure fabricated by the process of the invention.

FIG. 19 is an enlarged view of a hollow beam structure 260 which illustrates the variety of shapes which are possible utilizing the process of the present invention. A part of the structure is cut away at 262 to illustrate the locations of the channels formed in the hollow beams.

It will be understood that long beams such as the beam 270 illustrated in FIG. 20 and having high aspect ratios of 10 to 1 or more can be manufactured utilizing a large number of channel vias 272. These vias may be aligned along top surface of the beam, or may be aligned on the top surface of the substrate if the channels are to be fabricated within the substrate itself, to produce enlarged hollow beam channels 274. However, the use of longitudinally aligned channel vias places a lower limit on the width of the beam and of the channel 274, for the sidewalls 276 and 278 will be spaced apart further than the minimum feature size. Thus, if the via has a width x, the minimum width of the beam will be 3x. This limitation can be overcome by placing channel vias at an angle with respect to the longitudinal dimension of the beam, as illustrated in FIGS. 21(a) and 21(b), which correspond to FIGS. 3 and 4, respectively, of the process described above. In the original process, the beam 30 is defined by the width of the patterns in the oxide layer 12. The resist 22 functions as a protective cap to prevent etching through the channel vias until desired. This results in a minimum beam width equal to three times the minimum feature size possible. In contrast, FIG. 21(a) depicts the alternative case where transverse vias 284 are used so the width of the beam is defined by the width of a resist layer 286. The resist layer functions to define the beams and serves as a protective plug to prevent etching through the channel vias until desired. This results in a minimum beam width equal to the minimum possible feature size. The process of FIGS. 3–8 may then be carried out as described above to produce a released beam with oxide sidewalls. The angled channel vias, which extend across the top surface of the beam and through which the silicon of the beam can be etched away to form the desired channel, facilitate the fabrication of the device and permit fabrication of thinner beams. Although the channel vias 284 are shown as being at about a 45° angle with respect to the longitudinal direction of the beam to be produced, it will be understood the angle is not critical and in fact the vias may be perpendicular to the sidewalls of the beams.

In the fabrication process it has been found that there is a direct relationship between the width of a channel via and the etch rate within the channel, for the etch rate is affected by the gas transport effects produced by channel width. Although it appears desirable to make the channel vias large in order to facilitate lithography and etching, the width of the via defines the distance that the sealing oxide must traverse in order to seal a channel. As this distance increases, the amount of deposited film required to bridge the gap also increase, and this can lead to significant amounts of oxide being deposited on the sidewalls of structures, thereby reducing the minimum spacing of features, increasing difficulties associated with film stresses, and degrading the dynamic performance of springs made from the channel beams. Further, if channel vias aligned with the longitudinal length of the beam are too long, the sidewalls of suspended channels will tend to bend outwardly away from each other due to film stress gradients. This effect can be limited by interposing spaces between adjacent channel vias so that bridges linking in the sidewalls are formed to hold them in place.

It will be noted that channel vias can be placed side by side to increase the lateral extent of channels or to create large reservoirs. However, film stresses and the mechanical durability of thin membranes positioned over these large etched areas limit their size.

As noted above, when vias are sealed, a significant thickness of material may be deposited on the sidewalls of the beam structures, significantly increasing the width of such structures. This has the greatest impact in narrowing the gaps between fingers in a comb drive and in the increase in the width of springs. The narrowing of gaps between fingers should only be a problem if it creates an aspect ratio that is too high to effectively coat the fingers with sputtered metal. However, increasing the width of the springs is more important since in order to vibrate any structure containing fluid there must be a path which allows fluid flow into the suspended structure. This path will include a suspended channel which imposes a minimum spring constant for the device as a whole.

In accordance with the invention, intersecting channels and channels having linear as well as curved paths may be fabricated by the present invention. In the fabrication of sample beams and channels, channels generally rectangular in cross-section were fabricated with widths ranging from one micrometer to fifteen micrometers and with depths ranging from two micrometers to fifteen micrometers. Water was pumped through channels exceeding ten millimeters in length. Lateral and torsional comb drive actuators incorporating beams including channels have been fabricated and water has been pumped through them. The change of resonant frequency due to the presence of liquid in the channels was verified, and in torsional actuators, resonant frequencies were found to shift from 94 kHz to 84 kHz. Lateral actuators with solid and hollow springs were also fabricated and in tests it was found that the resonant frequency shifted from 15 kHz for solid beams to 14 kHz for hollow beams.

Although the invention has been described in terms of preferred embodiments, it will be apparent that numerous modifications and variations may be made without departing from the true spirit and scope thereof, as set forth in the following claims.

What is claimed is:

1. A microfabricated subsurface structure, comprising:
    a single crystal silicon substrate;
    a cavity in a surface of said substrate;
    a released beam fabricated from said silicon substrate, cantilevered from a wall of said cavity and extending into said cavity, and movable therein;
    a subsurface channel within and extending along the length of said beam; and
    at least one via in a surface of said beam for fabricating said channel, and a seal for said via to enclose said channel.

2. The structure of claim 1, wherein said beam includes multiple spaced apart channels along the length of the beam.

3. The structure of claim 2, further including multiple vias spaced along a surface of said beam for fabricating said spaced channels, and seals for said vias to enclose said channels.

4. The structure of claim 1, further including a subsurface channel in said substrate connected to said channel in said beam.

5. The structure of claim 4, further including at least one inlet port in said substrate leading to said substrate channel for connection of external equipment to said channel.

6. The structure of claim 1, further including an electrically insulating layer within said subsurface channel.

7. The structure of claim 1, wherein said channel includes silicon dioxide walls.

8. The structure of claim 1, further including a metal layer on said beam.

9. The structure of claim 1, further including multiple subsurface channels spaced along said beam, and insulating segments in said beam separating adjacent channels.

10. The structure of claim 1, wherein said beam incorporates at least one optically transparent sidewall to allow optical monitoring of said channel.

11. The structure of claim 1, further including multiple released beams mounted for motion in said cavity.

12. The structure of claim 11, wherein at least some of said released beams include channels, and wherein said beams are mounted to said cantilevered beam to form a backbone with laterally extending arms.

13. The structure of claim 12, wherein said cantilever beam is a torsional spring mounting said backbone to said substrate, said channel receiving fluids for varying the mechanical characteristics of said spring.

14. The structure of claim 1, wherein said beam includes multiple channels spaced apart along the length of the beam, and an electrically insulating layer within each said channel.

15. The structure of claim 14, wherein said insulating layer is silicon dioxide.

16. The structure of claim 1, further including an elongated released beam mounted on and extending transversely to said cantilevered beam, said cantilevered beam forming a torsional spring supporting said elongated beam for motion in said cavity.

17. The structure of claim 16, further including:
    a subsurface channel in said substrate connected to said channel in said cantilevered beam; and
    at least one inlet port in said substrate leading to said substrate channel for supplying fluid to said channel in said cantilevered beam for varying the mechanical characteristics of said cantilevered beam.

18. A microfabricated subsurface structure comprising:
    a single crystal silicon substrate;
    a cavity in a surface of said substrate;
    a released beam extending into said cavity and moveable therein;
    multiple spaced subsurface channels within and extending along the length of said beam; and
    insulating segments in said beam separating adjacent channels.

19. The structure of claim 18, wherein said beam is fabricated from said silicon substrate and is cantilevered from a wall of said cavity.

20. The structure of claim 19, further including multiple vias spaced along a surface of said beam for fabricating corresponding spaced channels, and seals for said vias.

* * * * *